(12) United States Patent
Takahashi

(10) Patent No.: US 6,806,019 B2
(45) Date of Patent: Oct. 19, 2004

(54) HIGH-RESOLUTION PHOTOSENSITIVE RESIN COMPOSITION USABLE WITH I-LINE AND METHOD OF FORMING PATTERN

(75) Inventor: Shuichi Takahashi, Shizuoka (JP)

(73) Assignee: Clariant Finance (BVI) Limited, Tortola (VG)

( * ) Notice: Subject to any disclaimer, the term of this patent is extended or adjusted under 35 U.S.C. 154(b) by 0 days.

(21) Appl. No.: 10/203,359

(22) PCT Filed: Dec. 11, 2001

(86) PCT No.: PCT/JP01/10857

§ 371 (c)(1),
(2), (4) Date: Aug. 8, 2002

(87) PCT Pub. No.: WO02/48793

PCT Pub. Date: Jun. 20, 2002

(65) Prior Publication Data

US 2003/0022093 A1 Jan. 30, 2003

(30) Foreign Application Priority Data

Dec. 14, 2000 (JP) ........................................ 2000-379957

(51) Int. Cl.$^7$ ............................. G03F 7/023; G03F 7/30
(52) U.S. Cl. ........................ 430/165; 430/191; 430/192; 430/193; 430/326
(58) Field of Search ................................ 430/165, 191, 430/192, 193, 326

(56) References Cited

U.S. PATENT DOCUMENTS

| | | | | |
|---|---|---|---|---|
| 5,580,702 A | * | 12/1996 | Hayase et al. | 430/326 |
| 5,942,369 A | | 8/1999 | Ota et al. | 430/192 |
| 6,537,719 B1 | * | 3/2003 | Takahashi | 430/191 |

FOREIGN PATENT DOCUMENTS

| | | |
|---|---|---|
| EP | 1 143 298 | 10/2001 |
| JP | 55-129341 | 10/1980 |
| JP | 58-122533 | 7/1983 |
| JP | 6-194827 | 7/1994 |
| JP | 6-194835 | 7/1994 |

OTHER PUBLICATIONS

English abstract for JP 55–129341, Oct. 7, 1980, Daicel Ltd.
English abstract for JP 58–122533, Jul. 21, 1983, Somar Mfg Co. Ltd.
English abstract for JP 6–194827, Jul. 15, 1994, Sumitomo Chem. Co. Ltd.
English abstract for JP 6–194835, Jul. 15, 1994, Sumitomo Chem. Co. Ltd.
English abstract for JP 02–110462, Apr. 23, 1990.

* cited by examiner

Primary Examiner—John S. Chu
(74) Attorney, Agent, or Firm—Sangya Jain

(57) ABSTRACT

A radiation sensitive resin composition for i-line light exposure comprising an alkaline soluble resin and a quinonediazide group-containing photosensitizer where said alkaline soluble resin comprises a novolak resin and a mixture of one or two or more of resins selected from the group of (i) polyacrylate, (ii) polymethacrylate, (iii) a polystyrene derivative and (iv) a copolymer consisting of two or more of monomer units selected from the group of acrylic ester, methacrylic ester and styrene derivatives is applied on a substrate such as a substrate for a flat panel display and exposed preferably at the light-exposure quantity of 50 to 500 mJ/cm$^2$ by an i-line light exposure source to form a pattern with high-resolution and a good pattern shape having no tailing.

14 Claims, No Drawings

HIGH-RESOLUTION PHOTOSENSITIVE RESIN COMPOSITION USABLE WITH I-LINE AND METHOD OF FORMING PATTERN

TECHNICAL FIELD

This invention relates to a pattern forming method by i-line light exposure and a radiation sensitive resin composition used therefor which is suitable for a manufacturing of semiconductor devise, flat panel display (FPD), etc.

BACKGROUND ART

In the wide field of manufacturing semiconductor integrated circuits such as LSI, producing a display surface of FPD, manufacturing a circuit substrate for thermal head etc., and like use, photolithography technique has so far been employed for forming microelements or conducting fine processing. In the photolithography technique, a positive or negative-working radiation sensitive resin composition is used for forming a resist pattern. Of these radiation sensitive resin compositions, those compositions comprising an alkali-soluble resin and a photosensitizer of quinonediazide compound are popularly used as the positive-working radiation sensitive resin compositions. As such compositions, there are described compositions having different formulations as, for example, 'novolak resin/quinonediazide compound' in many documents such as Japanese Examined Patent Publication No. documents such as Japanese Examined Patent Publication No. S54-23570 (U.S. Pat. No. 3,666, 473), Japanese Examined Patent Publication No. S56-30850 (U.S. Pat. No. 4,115,128), Japanese Unexamined Patent Publication Nos. S55-73045 and S61-205933, etc.

These compositions comprising a novolak resin and a quinonediazide compound have so far been studied and developed with respect to both novolak resins and radiation sensitive materials. In respect of novolak resins, there have been developed novel resins. In addition, radiation sensitive resin compositions having excellent properties have also been obtained by improving physical properties of conventionally known resins. For example, there are disclosed techniques providing a radiation sensitive resin composition having excellent properties by using a novolak resin with a particular molecular weight distribution in Japanese Unexamined Patent Publication Nos. S60-140235 and H01-105243 and by using a novolak resin from which low-molecular-weight components of the resin has been removed by fractionation in Japanese Unexamined Patent Publication Nos. S60-97347, S60-189739 and Japanese Patent Publication No.2590342.

On the other hand, degree of integration in semiconductor elements have been increased year by year and, in the manufacture of semiconductor elements or the like, processing of patterns with a line width of less than sub-micron order has become required. However, conventionally known radiation sensitive resin compositions can not satisfy enough these requirements in the prior art described above. Furthermore upon manufacturing a display surface of liquid crystal display (LCD) etc., the exposure by using exposure apparatus with g-line or g+h-line radiation source has been being conducted so far, however it has begun to examine a manufacturing process using i-line radiation source for forming a fine element and the radiation sensitive resin composition having high resolution suitable for i-line light exposure.

In order to realize the high resolving ability of a radiation sensitive resin composition for i-line light exposure, a technique to apply 1,2-naphthoquinone-2-diazide-5-sulfonic acid ester of 1,1,1-tris(4-hydroxy-3,5-dimethylphenyl) butane as a photosensitizer (Japanese Unexamined Patent Publication No. H06-332167), a technique to apply novolak resin derived from the particular phenolic compounds and photosensitizer (Japanese Unexamined Patent Publication Nos. H05-88364, H10-20503, and 2000-137324), a technique to apply photosensitive components containing naphthoquinonediazide sulfonic acid ester of trihydroxybenzophenone and trihydroxybenzophenone at the particular ratio (Japanese Unexamined Patent Publication No. H08-82926), a technique to apply an admixture of 1,2-naphthoquinone-2-diazide-5-sulfonic acid ester of 2,3,4-trihydroxybenzophenone with the particular esterification ratio and 1,2-naphthoquinone-2-diazide-5-sulfonic acid ester of 2,3,4,4'-tetrahydroxybenzophenone as a photosensitizer (Japanese Unexamined Patent Publication No. H02-109051), a technique to apply a photosensitizer restricting the amount of tetra ester component of 1,2-naphthoquinone-2-diazide-5 and/or 4-sulfonic acid ester of particular polyhydroxy compounds (Japanese Unexamined Patent Publication No. H09-15853), a technique to apply an admixture as a photosensitizer of 1,2-naphthoquinone-2-diazide-5-sulfonic acid ester and 1,2-naphthoquinone-2-diazide-4-sulfonic acid ester of 2,3,4,4'-tetrahydroxybezophenone at the particular mixing ratio have been being proposed. However in the prior art so far proposed, there are problems in view point of resolution and pattern form where the tailing occurred and it is desired to provide a radiation sensitive resin composition having high resolution and good pattern shape which can be applied for i-line light source exposure and the patter forming method using it.

Under the circumstances described above, an object of the present invention is to provide a radiation sensitive resin composition for i-line light exposure having high resolution and being able to form a good pattern without tailing etc. and a pattern forming method using it.

DISCLOSURE OF THE INVENTION

As a result of eager study and examination, the present inventors found that in pattern forming method using i-line light exposure source a radiation sensitive resin composition comprising an alkali-soluble resin and a quinonediazide group-containing photosensitizer wherein the alkali-soluble resin is a mixture of a novolak resin and one or more resins selected from (i) polyacrylate, (ii) polymethacrylate, (iii) a polystyrene derivative, and (iv) a copolymer consisting of two or more monomer units selected from acrylate, methacrylate and a styrene derivative can attain the above object and reached to the present invention.

It means the present invention relates to a pattern forming method which is characterized in that in pattern forming method using i-line light exposure source a radiation sensitive resin composition comprises an alkali-soluble resin and a quinonediazide group-containing photosensitizer wherein the alkali-soluble resin is a mixture of a novolak resin and one or more resins selected from (i) polyacrylate, (ii) polymethacrylate, (iii) a polystyrene derivative, and (iv) a copolymer consisting of two or more monomer units selected from acrylate, methacrylate and styrene derivatives.

Further the present invention relates to a radiation sensitive resin composition for i-line light exposure which is characterized in that a radiation sensitive resin composition comprises an alkali-soluble resin and a quinonediazide group-containing photosensitizer wherein the alkali-soluble resin is a mixture of a novolak resin and one or more resins selected from (i) polyacrylate, (ii) polymethacrylate, (iii) a polystyrene derivative, and (iv) a copolymer consisting of two or more monomer units selected from acrylate, methacrylate and styrene derivatives.

Hereinafter, the present invention will be described below further in more detail.

In the pattern forming method of the present invention i-line is used for light exposure source and as a radiation sensitive resin composition an alkali-soluble resin and a quinonediazide group-containing photosensitizer wherein the alkali-soluble resin is a mixture of a novolak resin and one or more resins selected from (i) polyacrylate, (ii) polymethacrylate, (iii) a polystyrene derivative, and (iv) a copolymer consisting of two or more monomer units selected from acrylate, methacrylate and styrene derivatives is used. The light exposure amount upon exposing i-line using the radiation sensitive resin composition of the present invention can be varied depending on the constitution of the radiation sensitive resin composition, however optimal exposure amount forming a pattern without tailing and being practically applied is 50 to 500 mJ/cm$^2$. When applied for FPD it preferably applied with 50 to 200 mJ/cm$^2$.

A novolak resin preferably used in a radiation sensitive resin composition for i-line light exposure of the present invention may be the novolak resin used in the radiation sensitive resin composition so far known comprising alkali-soluble resin and photosensitizer containing quinonediazide groups and is not limited particularly. A novolak resin preferably used in the present invention is obtained by polycondensation between a various kind of phenol species, singly or a mixture thereof and aldehyde such as formalin.

As the phenols to be used for preparing the novolak resin, there may be illustrated, for example, phenol, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene-bisphenol, methylene-bis-p-cresol, resorcinol, catechol, 2-methylresorcinol, 4-methylresorcinol, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, and the like. These are used independently or as a mixture of two or more thereof.

As the aldehydes, there may be illustrated paraformaldehyde, acetaldehyde, benzaldehyde, hydroxybenzaldehyde, chloroacetaldehyde, etc. as well as formalin. These are used singly or as a mixture of two or more thereof.

The weight average molecular weight of the novolak resin used in the radiation sensitive resin composition of the present invention, as determined using polystyrene standards, is preferably 2,000 to 50,000, more preferably 3,000 to 40,000.

On the other side as monomers constituting polyacrylate (i), polymethacrylate (ii), polystyrene derivatives (iii), a copolymer comprising two or more monomer units selected from the group of acrylic ester, methacrylic ester and styrene derivatives (iv), below illustrated acrylic esters, methacrylic esters and styrene derivatives are preferably raised.

Acrylic Ester:

Methyl acrylate, ethyl acrylate, n-propyl acrylate, n-butyl acrylate, n-hexyl acrylate, isopropyl acrylate, isobutyl acrylate, t-butyl acrylate, cyclohexyl acrylate, benzyl acrylate, 2-chloroethyl acrylate, methyl-α-chloroacrylate, phenyl α-bromoacrylate etc.

Methacrylic Ester

Methyl methacrylate, ethyl methacrylate, n-propyl methacrylate, n-butyl methacrylate, n-hexyl methacrylate, isopropyl methacrylate, isobutyl methacrylate, t-butyl methacrylate, cyclohexyl methacrylate, benzyl methacrylate, phenyl methacrylate, 1-phenylethyl methacrylate, 2-phenylethyl methacrylate, furfuryl methacrylate, diphenylmethyl methacrylate, pentachlorophenyl methacrylate, naphthyl methacrylate, iso-boronyl methacrylate, benzyl methacrylate, etc.

Styrene Derivatives 4-fluorostyrene, 2,5-difluorostyrene, 2,4-difluorostyrene, p-isopropylstyrene, styrene, o-chlorostyrene, 4-acetylstyrene, 4-benzoylstyrene, 4-bromostyrene, 4-butoxycarbonylstyrene, 4-butoxymethylstyrene, 4-butylstyrene, 4-ethylstyrene, 4-hexylstyrene, 4-methoxystyrene, 4-methylstyrene, 2,4-dimethylstyrene, 2,5-dimethylstyrene, 2,4,5-trimethylstyrene, 4-phenylstyrene, 4-propoxystyrene, etc.

Further an organic acid monomer can be used as a copolymer component for the above described each polymer, if necessary. The preferable organic acid monomer can be illustrated below.

Organic Acid Monomer

Acrylic acid, methacrylic acid, itaconic acid, maleic anhydride, 2-acryloyl hydrogenphthalate, 2-acryloyloxypropyl hydrogenphthalate, etc.

When using an organic acid monomer as a copolymer component, acrylic ester, methacrylic ester and styrene derivative part in the copolymers show alkaline dissolution inhibition effect, whereas organic acid monomer part shows alkaline dissolution promotion effect. Therefore depending on the organic acid monomer content, it would be possible to balance dissolution inhibition effect and dissolution improvement in the light exposure area of the radiation sensitive resin composition to a developer.

Besides the weight average molecular weight of these polyacrylates, polymethacrylates, polystyrene derivatives or copolymers comprising two or more of monomer unit selected from the group consisting of acrylic esters, methacrylic esters, and styrene derivatives is preferably 2,000 to 80,000 as determined using polystyrene standards and is more preferably 5,000 to 40,000. The content of these polyacrylates, polymethacrylates, polystyrene derivatives or copolymers comprising two or more of monomer unit selected from the group consisting of acrylic esters, methacrylic esters, and styrene derivatives is preferably 0.1 to 10.0 parts by weight relative to 100 parts by weight of novolak resin and more preferably 0.5 to 5.0 parts by weight.

As a photosensitizer containing quinonediazide groups used in a radiation sensitive resin composition for i-line light exposure of the present invention, any publicly known photosensitizer containing quinonediazide groups can be used and particularly one obtained by the reaction between quinonediazide-sulfonic acid halide such as naphthoquinonediazide-sulfonic acid chloride or benzoquinonediazide-sulfonic acid chloride and low or high molecular weight compounds containing functional groups which can be condensed with these acid halide is preferred. As functional groups which can be condensed with these acid halide, hydroxyl group or amino group can be exemplified and as low molecular compounds containing hydroxyl groups for example, hydroquinone, resorcin, 2,4-dihydroxybenzophenone, 2,3,4-trihydroxybenzophenone, 2,4,6-trihydroxybenzophenone, 2,4,4'- trihydroxybenzophenone, 2,3,4,4'-tetrahydroxybenzophenone, 2,2',4,4'-tetrahydroxybenzophenone, 2,2',3,4,6'-pentahydroxybenzophenone etc. Examples of the high molecular compound containing hydroxyl group include novolak resin and polyhydroxystyrene etc.

The content of a photosensitizer containing quinonediazide groups of the present invention is preferred to be 10 to 30 parts by weight, more preferably 15 to 25 parts by weight relative to 100 parts by weight of resin component in the radiation sensitive resin composition. In the case of less than 10 parts by weight the film remaining rate tends to decrease or the process margin such as development time dependency tends to be deteriorated drastically. In the case of exceeding 30 parts by weight, it could cause a practical problem due to too low sensitivity or causing the precipitation of photosensitizer.

In the present invention, it is further preferred to incorporate the low molecular compounds having the phenolic hydroxy group(s) represented by the general formula (I) below into the radiation sensitive resin composition.

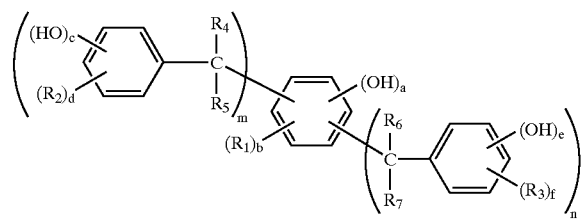

(I)

wherein $R_1$, $R_2$, $R_3$, $R_4$, $R_5$, $R_6$ and $R_7$ independently represent H, a $C_1$–$C_4$ alkyl group, a $C_1$–$C_4$ alkoxyl group, a cyclohexyl group, or a group represented by the formula:

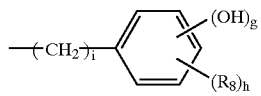

wherein $R_8$ represents H, a $C_1$–$C_4$ alkyl group, a $C_1$–$C_4$ alkoxyl group or a cyclohexyl group; m and n each are 0, 1 or 2; a, b, c, d, e, f, g and h are integers of 0 or 1 to 5 satisfying a +b≦5, c+d≦5, e+f≦5, and g+h≦5; and i is 0, 1 or 2.

The low molecular compounds having the phenolic hydroxy group(s) represented by the general formula (I) is preferably used to control a dissolution rate usually as a dissolution promoter in the radiation sensitive resin composition of the present invention or to improve the sensitivity of the radiation sensitive resin composition or to control the sensitivity.

As the low-molecular compound having phenolic hydroxyl group or groups represented by the above general formula (I), there are illustrated, for example, o-cresol, m-cresol, p-cresol, 2,4-xylenol, 2,5-xylenol, 2,6-xylenol, bisphenol A, B, C, E, F, or G, 4,4',4"-methylidinetrisphenol, 2,6-bis[(2-hydroxy-5-methylphenyl)methyl]-4-methylphenol, 4,4'-[1-[4-[1-(4-hydroxyphenyl)-1-methylethyl]phenyl]ethylidene]bis-phenol, 4,4',4"-ethylidinetrisphenol, 4-[bis(4-hydroxyphenyl)methyl]-2-ethoxyphenol, 4,4'-[(2-hydroxyphenyl)methylene]bis[2,3-dimethylphenol], 4,4'-[(3-hydroxyphenyl)methylene]bis[2,6-dimethylphenol], 4,4'-[(4-hydroxyphenyl)methylene]bis[2,6-dimethylphenol], 2,2'-[(2-hydroxyphenyl)methylene]bis[3,5-dimethylphenol], 2,2'-[(4-hydroxyphenyl)methylene]bis[3,5-dimethylphenol], 4,4'-[(3,4-dihydroxyphenyl)methylene]bis[2,3,6-trimethylphenol], 4-[bis(3-cyclohexyl-4-hydroxy-6-methylphenyl)methyl]-1,2-benzenediol, 4,6-bis[(3,5-dimethyl-4-hydroxyphenyl)methyl]-1,2,3-benzenetriol, 4,4'-[(2-hydroxyphenyl)methylene]bis[3-methylphenol], 4,4',4"-(3-methyl-1-propanyl-3-ylidine)trisphenol, 4,4',4",4'''-(1,4-phenylenedimethylidine)tetrakisphenol, 2,4,6-tris[(3,5-dimethyl-4-hydroxyphenyl)methyl]-1,3-benzenediol, 2,4,6-tris[(3,5-dimethyl-2-hydroxyphenyl)methyl]-1,3-benzenediol, 4,4'-[1-[4-[1-[4-hydroxy-3,5-bis[(hydroxy-3-methylphenyl]methyl]phenyl]-1-methylethyl]phenyl]ethylidene]bis[2,6-bis(hydroxy-3-methylphenyl)methyl]phenol, and the like. These low-molecular compounds having phenolic hydroxyl group or groups are used in an amount of usually 1 to 20 parts by weight, preferably 3 to 15 parts by weight relative to 100 parts by weight of the novolak resin.

The fluorescent material can be added into the radiation sensitive resin composition of the present invention. The fluorescent material to be used into the radiation sensitive resin composition of the present invention include naphthalene and naphthalene derivatives, e.g., 1-hydroxynaphthalene, 1-methylnaphthalene, 2,3-dimethylnaphthalene, 1-aminonaphthalene, 2-fluoronaphthalene, 2-chloronaphthalene, 1,7-diphenylnaphthalene, and the like; anthracene and anthracene derivatives, e.g., 9-methylanthracene, 9,10-dimethylanthracene, 9-cyanoanthracene, 1-aminoanthracene, 9-phenylanthracene, 9,10-diphenylanthracene, 9,10-dichloroanthracene, 9,10-dinaphthylanthracene, 9-vinylanthracene, 9-(p-vinylphenyl)-10-phenylanthracene, and the like; phenanthrene and phenanthrene derivatives, e.g., 3,4'-benzophenanthrene, 2-phenylphenanthrene, and the like; pyrene and pyrene derivatives, e.g., 1,3,6,8-tetraphenylpyrene, bipyrenyl, o-phenylenepyrene, and the like; perylene and perylene derivatives, e.g., benzoperylene and the like; fluorene and fluorene derivatives, e.g., 1-methylfluorene, 1,2-benzofluorene, and the like; carbazole and carbazole derivatives, e.g., N-methylcarbazole, N-methylbenzocarbazole, N-phenylcarbazole, N-vinylcarbazole, and the like; biphenyl and biphenyl derivatives, e.g., 4-methylphenylbiphenyl, 3,3'-dimethylbiphenyl, 4-methoxybiphenyl, 4,4'-dimethoxybiphenyl, 4,4'-dihydroxybiphenyl, 4-benzylbiphenyl, 4-vinylbiphenyl, octamethylbiphenyl and the like; p-terphenyl and p-terphenyl derivatives, e.g., 4-methylterphenyl, 2-methyl-p-terphenyl, 3,3"-dimethylterphenyl, 4-(3,3-dimethylbutoxy)-p-terphenyl, 2,2'-methylene-p-terphenyl, and the like; p-quaterphenyl and p-quaterphenyl derivatives, e.g., 3,3'''-dimethyl-p-quaterphenyl, tetramethyl-p-quaterphenyl, 4-(3-ethylbutoxy)-p-quaterphenyl, and the like; indole and indole derivatives, e.g., 2-phenylindole, 1-methyl-2-phenylindole, 1-N-butyl-2-biphenylindole, 1,2-diphenylindole, 1-biphenyl-2-indole, and the like; acridine and derivatives thereof, naphthacene and derivatives thereof; rublene and derivatives thereof; chrysene and derivatives thereof; and so on. It is preferable that these fluorescent materials are selected by taking into account the absorption wavelength range of the photosensitizer to be combined and then these fluorescent materials may be used singly or in a combination of two or more. The amount of the fluorescent material to be incorporated is 0.0001 to 1.0 parts by weight relative to 100 parts by weight of the photosensitizer, preferably 0.0005 to 0.5 parts by weight. The incorporation of these fluorescent materials can improve the sensitivity.

The solvents for dissolving an alkali soluble resin, a photosensitizer and the dissolution promoter represented by the general formula (I) of the present invention include ethylene glycol monoalkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; propylene glycol monoalkyl ethers such as propylene glycol monomethyl ether and propylene glycol monoethyl ether; propylene glycol monoalkyl ether acetates such as propylene glycol monomethyl ether acetate and propylene glycol monoethyl ether acetate; lactates such as methyl lactate and ethyl lactate; aromatic hydrocarbons such as toluene and xylene; ketones such as methyl ethyl ketone, 2-heptanone, and cyclohexanone; amides such as N,N-dimethylacetamide and N-methylpyrrolidone; lactones such as γ-butyrolactone; and so on. These solvents are used singly or in a combination of two or more thereof.

Further, dyestuffs, adhesive aids, surfactants etc. may be incorporated as necessary into the radiation sensitive resin composition of the present invention. The dyestuffs include e.g. Methyl Violet, Crystal Violet, Malachite Green etc.; the adhesive aids include e.g. alkyl imidazoline, butyric acid, alkyl acid, polyhydroxystyrene, polyvinylmethyl ether, t-butyl novolak, epoxy silane, epoxy polymer, silane etc.; and the surfactants include e.g. nonionic surfactants such as polyglycols and derivatives thereof, that is, polypropylene glycol or polyoxyethylene lauryl ether, fluorine-containing surfactants such as Fluorad (trade name; manufactured by Sumitomo 3M Ltd.), Megafac (trade name; manufactured by Dai-Nippon Ink & Chemicals, Inc.), Sulflon (trade name; manufactured by Asahi Glass Co., Ltd.) or organosiloxane surfactants such as KP341 (trade name; Shin-Etsu Chemical Co., Ltd.).

By the way the resist sensitivity has a property which cannot be determined in one to one relation since the resist sensitivity is significantly sensitive to a process condition and the value of sensitivity can be determined only when its process condition is determined as some condition like uncertainty principle. The optimal radiation exposure quantity described in the present invention is the values measured in the below described process condition. First as a substrate is used 4 inch-silicon wafer or glass wafer. Coating condition is to coat resist by spin coating method with a rotation number which gives 1.5 microns resist film thickness when prebaked at 100° C. for 90 seconds. And then an exposure to light is conducted by using the stepper produced by Hitachi Co., Ltd. (light source i-line, wavelength 365 nm, NA=0.50) as a light-exposure apparatus. A development condition after exposure to light is to use 2.38 weight % TMAH (tetramethylammonium hydroxide) as a developer and to develop by puddle system at 23° C. for 60 seconds, after that the substrate is rinsed with pure water for 60 seconds and to dried-up. The above is the process condition when measuring an optimal light-exposure quantity described in the present invention and an optimal light-exposure quantity will change when this process condition is altered.

BEST MODE FOR PRACTICING THE INVENTION

The present invention will now be described more specifically by reference to Examples which, however, are not to be construed to limit the present invention in any way.

EXAMPLE 1

To 100 parts by weight of a novolak resin having weight average molecular weight, 8,000 as determined using polystyrene standards were added 2 parts by weight of poly (methyl methacrylate-co-n-butyl methacrylate), 21 parts by weight of an esterification product between 2,3,4,4'-tetrahydroxy-benzophenone and 1,2-naphthoquinonediazide-5-sulfonyl chloride having average esterification rate of 75%, 5 parts by weight of 4,4'-[1-[4-[1-(4-hydroxyphenyl)-1-methyethyl]phenyl]ethylidene] bisphenol were dissolved in 390 parts by weight of propylene glycol monomethyl ether acetate, after adding thereto 300 ppm of a fluorine-containing surfactant, Megafac (manufactured by Dai-Nippon Ink & Chemicals, Inc.) to the total solid content, the solution was stirred and filtered through a 0.2-μm filter to prepare a radiation sensitive resin composition of the present invention. This composition was spin-coated on a 4-inch silicon wafer and a 4-inch glass wafer, and baked on a hot plate at 100° C. for 90 seconds to obtain a 1.5-μm thick resist layer. These resist layers were exposed by an i-line stepper (NA=0.5) made by Hitachi Co., Ltd. and developed in a 2.38 weight-% aqueous solution of TMAH at 23° C. for 60 seconds. After that an optimal light-exposure quantity, a limit resolution and a pattern form by scanning electronic microscope were respectively observed and then the optimal light-exposure quantities were 80 mJ/cm$^2$ for 4-inch silicon wafer, 72 mJ/cm$^2$ for 4-inch glass wafer, the limit resolutions were both 0.5 microns and the pattern shapes were both rectangular which was good.

EXAMPLE 2

The same manner was taken as Example 1 apart from using a mixture (50:50 mixing ratio) of an esterification product between 2,3,4,4'-tetrahydroxy-benzophenone and 1,2-naphthoquinonediazide-5-sulfonyl chloride having average esterification rate of 87.5% and an esterification product between 2,3,4,4'-tetrahydroxy-benzophenone and 1,2-naphthoquinonediazide-5-sulfonyl chloride having average esterification rate of 75% and the optimal light-exposure quantities were 85 mJ/cm$^2$ for 4-inch silicon wafer, 77 mJ/cm$^2$ for 4-inch glass wafer, the limit resolutions were both 0.5 microns and the pattern shapes were both rectangular which was good.

EXAMPLE 3

The same manner was taken apart from anthracene, $2.1 \times 10^{-5}$ parts by weight (0.0001 parts by weight to the photosensitizer) being added as a fluorescent material and the optimal light-exposure quantities were 75 mJ/cm$^2$ for 4-inch silicon wafer, 68 mJ/cm2 for 4-inch glass wafer, the limit resolutions were both 0.5 microns and pattern shapes were both rectangular which was good.

EXAMPLE 4

The same manner was taken apart from anthracene, $1.05 \times 10^{-3}$ parts by weight (0.005 parts by weight to the photosensitizer) being added as a fluorescent material and the optimal light-exposure quantities were 71 mJ/cm$^2$ for 4-inch silicon wafer, 64 mJ/cm2 for 4-inch glass wafer, the limit resolutions were both 0.5 microns and the pattern shapes were both rectangular which was good.

EXAMPLE 5

The same manner was taken apart from anthracene, $2.1 \times 10^{-2}$ parts by weight (0.1 parts by weight to the photosensitizer) being added as a fluorescent material and the optimal light-exposure quantities were 74 mJ/cm² for 4-inch silicon wafer, 67 mJ/cm2 for 4-inch glass wafer, the limit resolutions were both 0.5 microns and the pattern shapes were both rectangular which was good.

Comparative Example 1

The same manner was taken as Example 1 apart from using 25 parts by weight of an esterification product between 2,3,4,4'-tetrahydroxy-benzophenone and 1,2-naphthoquinonediazide-5-sulfonyl chloride having average esterification rate of 75% and without using poly(methyl methacrylate-co-n-butyl methacrylate) and the optimal light-exposure quantities were 80 mJ/cm² for 4-inch silicon wafer, 72 mJ/cm2 for 4-inch glass wafer, the limit resolutions were both 0.75 microns and the pattern shapes showed both tailing which was worse pattern in verticality compared with those of Examples.

Effectiveness of Invention

As mentioned above the pattern with high resolution and good pattern shape by i-line light-exposure can be formed by the present invention.

Industrial Applicability

The radiation sensitive resin composition of the present invention can be properly used for manufacturing semiconductor devices, flat panel display (FPD), etc. as a photoresist material.

What is claimed is:

1. A method of forming a pattern with i-line as an exposure light source by use of a radiation sensitive resin composition comprising an alkali-soluble resin and a quinonediazide group-containing photosensitizer wherein the alkali-soluble resin is a mixture of a novolak resin and one or more resins selected from (i) polyacrylate polymerized with an acrylic ester monomer (ii) polymethacrylate polymerized with a methacrylic ester monomer (iii) a polystyrene derivative, and (iv) a copolymer consisting of two or more monomer units selected from acrylic ester, methacrylic ester, a styrene derivative and an organic acid monomer; wherein said acrylic ester is a monomer unit selected from a group consisting of methyl acrylate, ethyl acrylate, n-propyl acrylate, n-butyl acrylate, n-hexyl acrylate, isopropyl acrylate, isobutyl acrylate, t-butyl acrylate, cyclohexyl acrylate, benzyl acrylate, 2-chloroethyl acrylate, methyl-α-chloroacrylate, and phenyl α-bromoacrylate; and, further wherein methacrylic ester is a monomer unit selected from a group consisting of methyl methacrylate, ethyl methacrylate, n-propyl methacrylate, n-butyl methacrylate, n-hexyl methacrylate, isopropyl methacrylate, isobutyl methacrylate, t-butyl methacrylate, cyclohexyl methacrylate, benzyl methacrylate, phenyl methacrylate, 1-phenylethyl methacrylate, 2-phenylethyl methacrylate, furfuryl methacrylate, diphenylmethyl methacrylate, pentachlorophenyl methacrylate, naphthyl methacrylate, isoboronyl methacrylate, and benzyl methacrylate.

2. A radiation sensitiye resin composition for i-line light exposure comprising an alkali-soluble resin and a quinonedlazide group-containing photosensitizer, wherein the alkali-soluble resin is a mixture of a novolak resin and one or more resins selected from (i) polyacrylate polymerized with an acrylic ester monomer (ii) polymethacrylate polymerized with a methacrylic ester monomer (iii) a polystyrene derivative, and (iv) a copolymer consisting of two or more monomer units selected from acrylic ester, methacrylic ester, a styrene derivative and an organic acid monomer; wherein said acrylic ester is a monomer unit selected from a group consisting of methyl acrylate, ethyl acrylate, n-propyl acrylate, n-butyl acrylate, n-hexyl acrylate, isopropyl acrylate, isobutyl acrylate, t-butyl acrylate, cyclohexyl acrylate, benzyl acrylate, 2-chloroethyl acrylate, methyl-α-chloroacrylate, and phenyl α-bromoacrylate; and, further wherein methacrylic ester is a monomer unit selected from a group consisting of methyl methacrylate, ethyl methacrylate, n-propyl methacrylate, n-butyl methacrylate, n-hexyl methacrylate, isopropyl methacrylate, isobutyl methacrylate, t-butyl methacrylate, cyclohexyl methacrylate, benzyl methacrylate, phenyl methacrylate, 1-phenylethyl methacrylate, 2-phenylethyl methacrylate, furfuryl methacrylate, diphenylmethyl methacrylate, pentachlorophenyl methacrylate, naphthyl methacrylate, isoboronyl methacrylate, and benzyl methacrylate.

3. The radiation sensitive resin composition for i-line light exposure according to claim 2, wherein the quinonediazide group-containing photosensitizer is an esterified product of tetrahydroxybenzophenone and 1,2-naphthoquinonediazide-sulfonic acid.

4. The radiation sensitive resin composition for i-line light exposure according to claim 2, wherein the quinonediazide group-containing photosensitizer is a mixture of esterified products of tetrahydroxybenzophenone and 1,2-naphthoquinonediazide-sulfonic acid.

5. The radiation sensitive resin composition for i-line light exposure according to claim 2, wherein a fluorescent material is incorporated in an amount of 0.0001 to 1.0 part by weight relative to 100 parts by weight of the quinonediazide group-containing photosensitizer.

6. The radiation sensitive resin composition for i-line light exposure according to claim 3, wherein the quinonediazide group-containing photosensitizer is a mixture of esterified products of tetrahydroxybenzophenone and 1,2-naphthoquinonediazide-sulfonic acid.

7. The radiation sensitive resin composition for i-line light exposure according to claim 3, wherein a fluorescent material is incorporated in an amount of 0.0001 to 1.0 part by weight relative to 100 parts by weight of the quinonediazide group-containing photosensitizer.

8. The radiation sensitive resin composition for i-line light exposure according to claim 4, wherein a fluorescent material is incorporated in an amount of 0.0001 to 1.0 part by weight relative to 100 parts by weight of the quinonediazide group-containing photosensitizer.

9. The radiation sensitive resin composition for i-line light exposure according to claim 2, where the organic acid monomer is selected from acrylic acid, methacrylic acid, itaconic acid, maleic anhydride, 2-acryoyl hydrogenphthalate and 2-acryloyloxypropyl hydrogenphthalate.

10. The method of forming a pattern for i-line light exposure according to claim 1, where the organic acid monomer is selected from acrylic acid, methacrylic acid, itaconic acid, maleic anhydride, 2-acryoyl hydrogenphthalate and 2-acryloyloxypropyl hydrogenphthalate.

11. The radiation sensitive resin composition for i-line light exposure according to claim 2, where the styrene derivative is selected from 4-fluorostyrene, 2,5-difluorostyrene, 2,4-difluorostyrene, p-isopropylstyrene, styrene, o-chlorostyrene, 4-acetylstyrene, 4-benzoylstyrene, 4-bromostyrene, 4-butoxycarbonylstyrene, 4-butoxymethylstyrene, 4-butylstyrene, 4-ethylstyrene, 4-hexylstyrene, 4-methoxystyrene, 4-methylstyrene, 2,4-dimethylstyrene, 2,5-dimethylstyrene, 2,4,5-trimethylstyrene, 4-phenylstyrene, and 4-propoxystyrene.

12. The method of forming a pattern for i-line light exposure according to claim 1, where the styrene derivative is selected from 4-fluorostyrene, 2,5-difluorostyrene, 2,4-difluorostyrene, p-isopropylstyrene, styrene, o-chlorostyrene, 4-acetylstyrene, 4-benzoylstyrene, 4-bromostyrene, 4-butoxycarbonylstyrene, 4-butoxymethylstyrene, 4-butylstyrene, 4-ethylstyrene, 4-hexylstyrene, 4-methoxystyrene, 4-methylstyrene, 2,4-dimethylstyrene, 2,5-dimethylstyrene, 2,4,5-trimethylstyrene, 4-phenylstyrene, and 4-propoxystyrene.

13. The method of forming a pattern for i-line light exposure according to claim 1, wherein the radiation sensitive composition further comprises a fluorescent material in an amount of 0.0001 to 1.0 part by weight relative to 100 parts by weight of the quinonediazide group-containing photosensitizer.

14. The method of forming a pattern for i-line light exposure according to claim 1, comprising the steps of forming a coating of the radiation sensitive composition on a substrate, image-wise exposing the coating, and developing the coating.

* * * * *